United States Patent [19]
Ivanov

[11] Patent Number: 5,808,501
[45] Date of Patent: Sep. 15, 1998

[54] VOLTAGE LEVEL SHIFTER AND METHOD

[75] Inventor: Vadim V. Ivanov, Tucson, Ariz.

[73] Assignee: Burr-Brown Corporation, Tucson, Ariz.

[21] Appl. No.: 816,990

[22] Filed: Mar. 13, 1997

[51] Int. Cl.⁶ .................................................. H03L 5/00
[52] U.S. Cl. ............................................. 327/333; 327/87
[58] Field of Search ........................... 327/538, 541–543, 327/333, 363, 67, 87

[56] References Cited

U.S. PATENT DOCUMENTS

| | | | |
|---|---|---|---|
| 3,075,648 | 1/1963 | Tobey, Jr. et al. | 307/297 |
| 4,480,231 | 10/1984 | Takehara | 330/261 |
| 4,573,021 | 2/1986 | Widlar | 330/273 |
| 4,701,646 | 10/1987 | Richardson | 307/570 |
| 5,061,862 | 10/1991 | Tamagawa | 307/296.1 |
| 5,153,500 | 10/1992 | Yamamoto et al. | 323/314 |
| 5,339,272 | 8/1994 | Tedrow et al. | 365/189 |
| 5,572,161 | 11/1996 | Myers | 327/538 |

Primary Examiner—Timothy P. Callahan
Assistant Examiner—An T. Luu
Attorney, Agent, or Firm—Cahill, Sutton & Thomas P.L.C.

[57] ABSTRACT

A precision voltage level shift circuit includes an emitter follower input circuit including a lateral PNP transistor having a base receiving an input voltage, and an emitter coupled to both an output terminal and a first current source. JFET is coupled between a collector of the input transistor and a first supply voltage conductor. A second PNP transistor has a base coupled to the collector of the first transistor and an emitter coupled to a second current source. A differential amplifier has a first input coupled to the output terminal, a second input coupled to the emitter of the second transistor, and an output coupled to the load element. The differential amplifier operates to maintain the voltage drop across the JFET at a level such that the emitter of the second PNP transistor is equal to the voltage of the emitter of the lateral PNP transistor to thereby maintain the collector-emitter voltage thereof at a constant value. Two of the voltage level shift circuits are used as input stages for an instrumentation amplifier.

14 Claims, 4 Drawing Sheets 5,808,501

VOLTAGE LEVEL SHIFTER AND METHOD

BACKGROUND OF THE INVENTION

The invention relates to circuits, such as emitter followers, which are useful in precisely shifting a voltage level, and more particularly to a voltage level shift circuit for use in an instrumentation amplifier that is operable from a single power supply, and even more particularly to improvements which produce a constant voltage level shift in a PNP emitter follower transistor, especially a lateral PNP emitter follower transistor.

FIG. 1 shows a PNP emitter follower input circuit which is believed to be the closest prior art. This circuit is used in an instrumentation amplifier such as the AMP04 instrumentation amplifier marketed by Analog Devices, Inc. In FIG. 1, level shift circuit 1 includes a lateral PNP transistor 2 having its collector connected to ground, its base connected to receive an input signal $V_{IN}$, and its emitter connected to an output conductor 8 and also to one terminal of a constant current source 3. (Such a transistor is referred to herein as an "emitter follower transistor".) The other terminal of constant current source 3 is connected to $+V_{CC}$.

A problem with the circuit shown in FIG. 1 is that the base-emitter voltage of lateral PNP transistor 2 is highly dependent on the collector-emitter voltage thereof, which is equal to $V_{OUT}$. Consequently, the base-emitter voltage of transistor 2, and hence the voltage level shift from $V_{IN}$ to $V_{OUT}$, can range from approximately 30 millivolts within the range of $V_{IN}$. This is unacceptable for a high precision circuit such as an instrumentation amplifier. The subsequent description of FIG. 3 indicates a shortcoming of a prior art instrumentation amplifier, wherein the input voltage can not be at or close to ground if only a single power supply is used.

It would be desirable to have a voltage level shift circuit that produces a shift which is independent of the value of the input voltage. It also would be desirable to have a way of stabilizing the collector-emitter voltage of a lateral PNP transistor functioning as an emitter follower to produce a constant voltage level shift. Similarly, it would be desirable to have a way of stabilizing the source-drain voltage of a field effect transistor functioning as a source follower to produce a constant voltage level shift.

It also would be desirable to have a low cost high precision integrated circuit instrumentation amplifier that permits both inputs to be at or close to ground and yet is operable from only a single power supply.

SUMMARY OF THE INVENTION

Accordingly, it is an object of the invention to provide a voltage shift circuit which produces a constant voltage shift, independently of the input voltage.

It is another object of the invention to provide a technique for stabilizing the collector-emitter voltage of lateral PNP transistor used as an emitter follower or the drain-source voltage of a field effect transistor used as a source follower.

It is another object of the invention to provide a low cost, precision integrated circuit instrumentation amplifier that allows both inputs to be at or near a ground voltage yet is operable from only a single power supply.

Briefly described, and in accordance with one embodiment thereof, the invention provides a precision voltage level shift circuit which includes an emitter follower input circuit including a first transistor having a base receiving an input voltage, an emitter coupled to an output terminal and a first current source. A load element is coupled between a collector of the input transistor and a first supply voltage conductor. A second transistor has a base coupled to the collector of the first transistor and an emitter coupled to a second current source. A differential amplifier has a first input coupled to the output terminal, a second input coupled to the emitter of the second transistor, and an output coupled to the load element. In one embodiment the first transistor is a lateral PNP transistor having the characteristic that its base-emitter voltage is strongly dependent on its collector-emitter voltage. The second transistor is a lateral PNP transistor, with its collector coupled to its base. Alternatively, the collector of the second transistor is coupled to the first supply voltage conductor, in which case the second transistor can be a substrate PNP transistor. (Those skilled in the art know that a "substrate PNP" transistor is one that includes P+ silicon wafer substrate material as its collector region, an N-type epitaxial layer on the P-type substrate as its base region, and a P-type region diffused or implanted in the N-type epitaxial layer as its emitter region.) In one preferred embodiment the load element is a P-channel JFET coupled between the collector of the first transistor and the first supply voltage conductor, with the output of the differential amplifier being coupled to the gate electrode of the P-channel JFET. The differential amplifier operates to maintain the voltage drop across the load element at a level such that the emitter of the second transistor is equal to the voltage of the emitter of the first transistor to thereby maintain the collector-emitter voltage of the first transistor at the nearly constant value of the base-emitter voltage of the second transistor. In one embodiment of the invention two of the voltage level shift circuits are used as input stages coupled between first and second input voltages of a single-supply instrumentation amplifier and non-inverting inputs of first and second operational amplifiers thereof, to allow the first and second input voltages to be at ground. In one embodiment of the invention the transistors are MOS field effect transistors (MOSFETs).

DETAILED DESCRIPTION OF THE PREFERRED EMBODIMENTS

Figure 1:
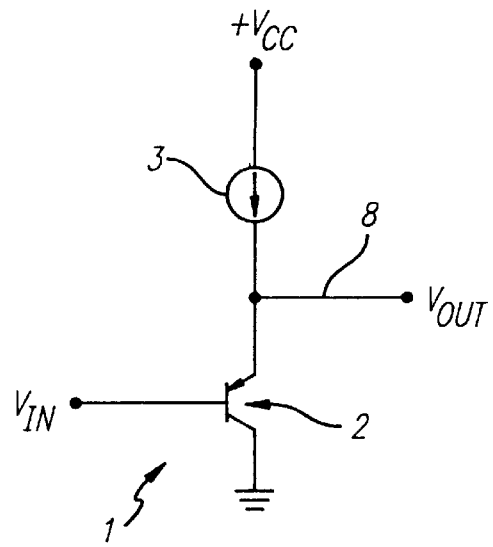
FIG. 1 is a schematic diagram of the closest prior art.
Figure 2:
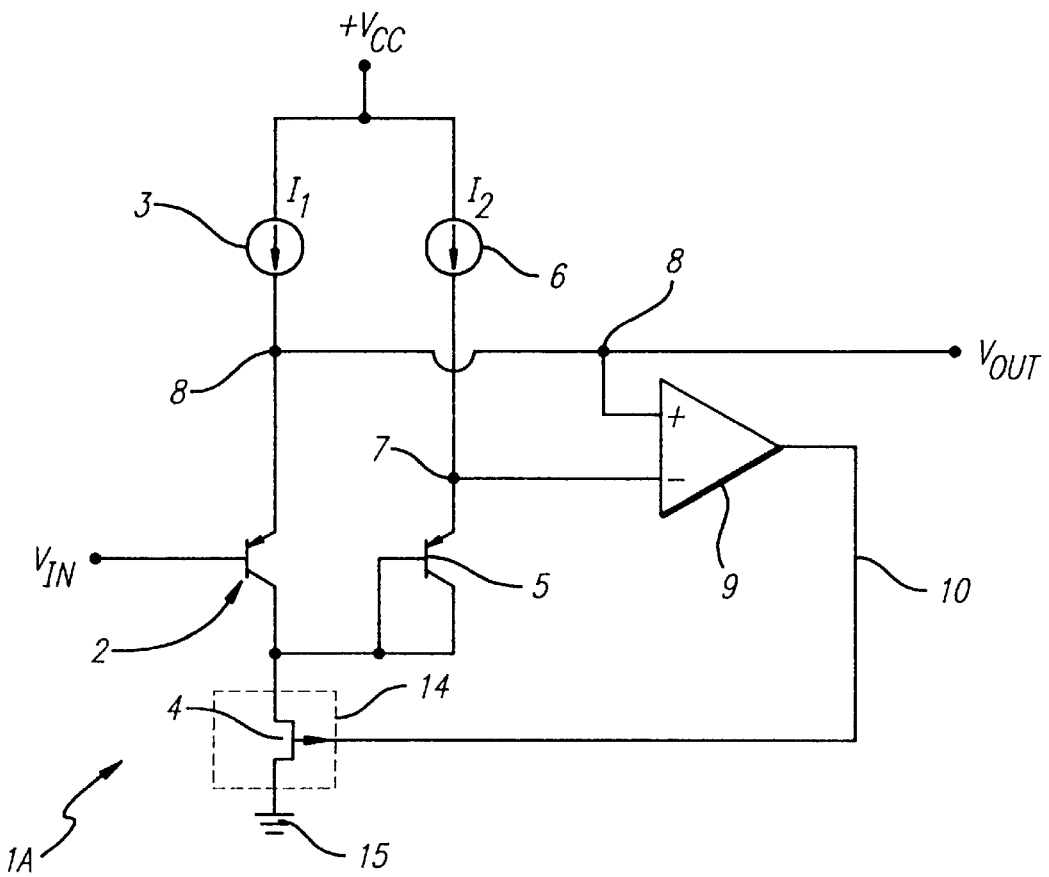
FIG. 2 is a schematic diagram of a preferred embodiment of the invention.

Referring to FIG. 2, voltage shift circuit 1A includes a lateral PNP emitter follower transistor 2, the base-emitter voltage $V_{BE(2)}$ of lateral PNP transistor 2 is known to be a strong direct function of the collector-emitter voltage $V_{CE(2)}$ thereof. The input voltage $V_{IN}$ is applied to the base of PNP transistor 2. The emitter of lateral PNP transistor 2 is connected by output conductor 8 to one terminal of a constant current source 3, the other terminal of which is connected to $+V_{CC}$. Preferably, a constant current $I_1$ is supplied by current source 3. The output voltage $V_{OUT}$ is produced on conductor 8 and is equal to one $V_{BE(2)}$ voltage above $V_{IN}$. The collector of lateral (or vertical) PNP transistor 2 is connected to the source of P-channel junction field effect transistor 4, the drain of which is connected to ground.

In accordance with the present invention, the collector of lateral PNP transistor 2 also is connected to the base and collector of a second lateral PNP transistor 5, which in FIG. 2 is connected as a diode-connected transistor. The emitter of diode-connected lateral PNP transistor 5 is connected by conductor 7 to the inverting input of a differential amplifier 9 to one terminal of a constant current source 6. Preferably, a constant current $I_2$ is supplied by current source 6. The other terminal of current source 6 is connected to $+V_{CC}$. The non-inverting input of differential amplifier 9 is connected to output conductor 8. The output of differential amplifier 9 is connected to the gate electrode of P-channel JFET 4.

The circuit shown in FIG. 2 maintains the collector-emitter voltage $V_{CE2}$ of PNP input transistor 2 at a constant voltage as follows. Differential amplifier 9 maintains the voltage on conductors 7 and 8 at the same value by producing whatever feedback signal is needed on conductor 10 to vary the channel resistance of JFET 4 so that its source-drain voltage plus the base-emitter voltage $V_{BE(5)}$ of transistor 5 results in the voltage on conductor 7 being exactly equal to the voltage on conductor 8. This causes the collector-emitter voltage $V_{CE(2)}$ of lateral PNP transistor 2 to be equal to the base-emitter voltage $V_{BE(5)}$ of PNP transistor 5. Since the constant current $I_2$ supplied by current source 6 flows through PNP transistor 5, its base-emitter voltage $V_{BE(2)}$ is very constant. With the voltages on conductors 7 and 8 being maintained equal by the action of differential amplifier 9, the collector-emitter voltage $V_{CE(2)}$ of transistor 2 also is essentially constant, so the voltage shift from $V_{IN}$ to $V_{OUT}$ therefore is essentially constant, independent of the magnitude of $V_{IN}$.

Note that it is desirable that the base-emitter voltage $V_{BE(5)}$ of transistor 5 be significantly less (e.g., 50 to 100 millivolts less) than the $V_{BE(2)}$ base-emitter voltage of lateral PNP transistor 2, and that this voltage difference be greater than the source-drain voltage of P-channel JFET 4. If this condition is met, then differential amplifier 9 will maintain the collector-emitter voltage $V_{CE(2)}$ equal to a constant value equal to $V_{BE(5)}$ when $V_{IN}$ is anywhere in the range from zero volts to nearly plus $V_{CC}$. Note also that $V_{BE(5)}$ can be made smaller in value than $V_{BE(2)}$ by increasing the ratio of $I_1$ to $I_2$ and/or decreasing the ratio of the emitter area of lateral PNP transistor 2 to the emitter area of PNP transistor 5.

Figure 3:
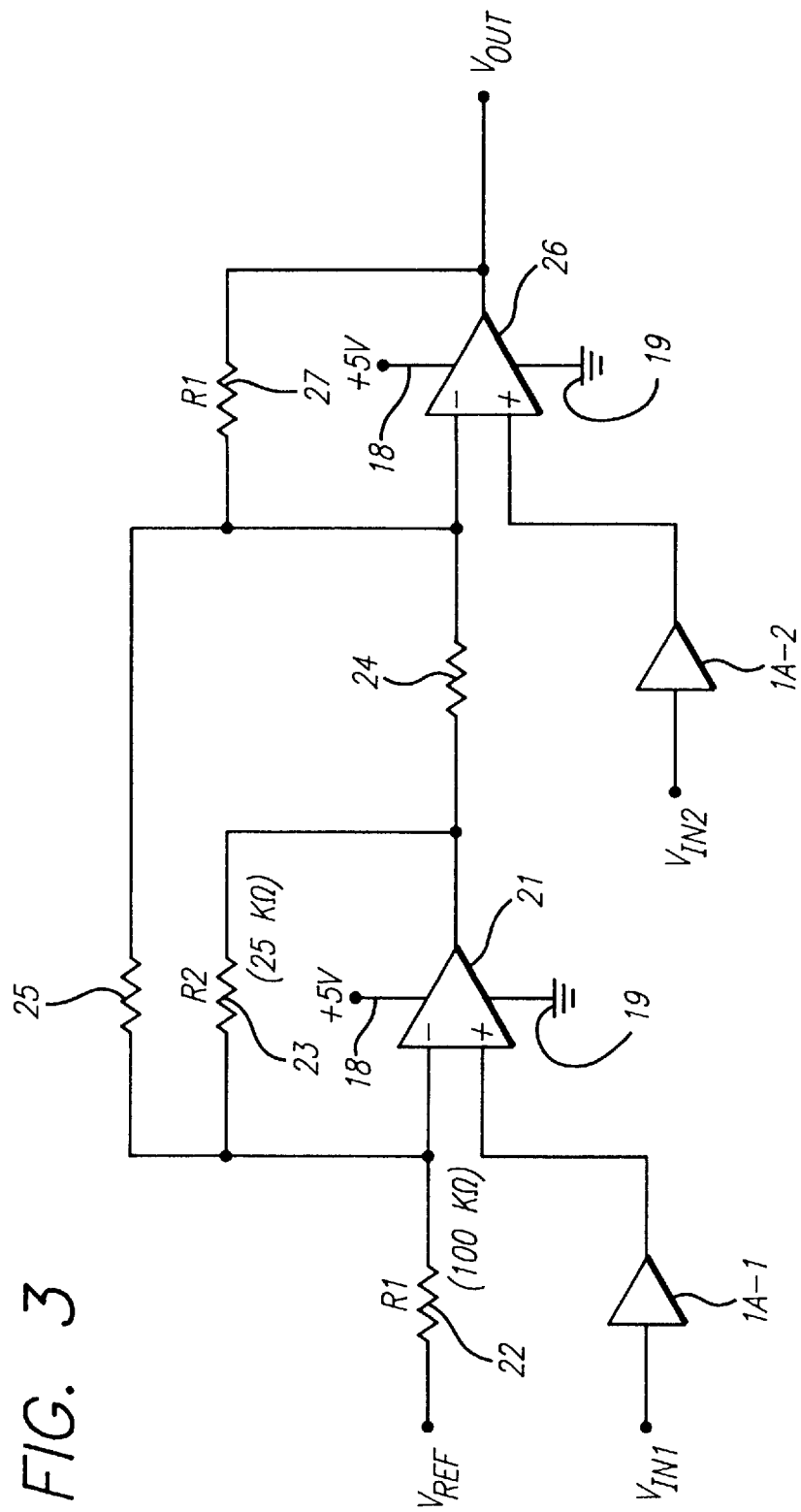
FIG. 3 is a schematic diagram illustrating use of the circuit of FIG. 2 in an instrumentation amplifier.

FIG. 3 shows how the voltage shift circuit 1A of FIG. 2 is incorporated into a well known basic instrumentation amplifier. (The voltage shift circuits of subsequently described FIGS. 4–6 also can be used.) Instrumentation amplifier 20 includes a first operational amplifier 21 connected between a +5 volt supply voltage conductor 18 and ground conductor 19. A fixed reference voltage $V_{REF}$ is coupled via a resistor 22 to the inverting input of operational amplifier 21. The non-inverting input of operational amplifier 21 is coupled by a first voltage level shift circuit 1A-1 to receive a first input signal $V_{IN1}$. The output of operational amplifier 21 is connected by a resistor 23 to the inverting input thereof. The output of operational amplifier 21 also is connected by a resistor 24 to the inverting input of a second operational amplifier 26, which also is biased between +5 volts and ground. The non-inverting input of operational amplifier 26 is connected to the output of a second voltage shift circuit 1A-2. A second input voltage $V_{IN2}$ is applied to the input of voltage shift circuit 1A-2. The inverting input of operational amplifier 26 is coupled by resistor 25 to the inverting input of operational amplifier 21. The inverting input of operational amplifier 26 is also coupled by resistor 27 to the output of operational amplifier 26, on which the output voltage $V_{OUT}$ is produced. Resistors 22 and 27 can have a resistance R1 of 100 kilohms, and resistor 23 can have a resistance R2 of 25 kilohms.

The instrumentation amplifier of FIG. 3 is identical to the prior art except for voltage shift circuits 1A-1 and 1A-2. In the prior art, $V_{IN1}$ and $V_{IN2}$ are applied directly to the non-inverting inputs of operational amplifier 1A-1 and 1A-2, respectively. If $V_{IN1}$ is at zero volts in the prior art instrumentation amplifier, then the output of operational amplifier 2-1 would necessarily be below ground in order to provide the feedback necessary to keep the inverting input thereof at the same zero voltage. This, of course, is not permissible in an integrated circuit implementation of the instrumentation amplifier in which only a single power supply providing ground on conductor 19 and +5 volts on conductor 18 is utilized. Consequently, a shortcoming of the closest prior art instrumentation amplifier is that it becomes inoperative if the input voltage $V_{IN1}$ is brought close to ground.

However, when the voltage level shift circuits 1A-1 and 1A-2 of the present invention are coupled between $V_{IN1}$ and $V_{IN2}$ and the non-inverting inputs of operational amplifiers 21 and 26, respectively, then $V_{IN1\ and\ VIN2}$ can be at ground, yet the operational amplifiers 21 and 26 will continue to operate properly. For example, with the above values of R1 and R2, and with $V_{IN1}$ and $V_{IN2}$ both equal to zero volts, the voltages applied to the inverting inputs of both operational amplifiers 21 and 26 will be (for example) +0.6 volts. The output of operational amplifier 21 will be 0.4 volts, and it will operate properly as a feedback amplifier. The constant $V_{BE}$ voltage drop for the input transistor 2 results in the precision necessary for an instrumentation amplifier. $V_{OUT}$ will be equal to the value of $V_{REF}$.

Thus, a low cost integrated circuit precision instrumentation amplifier operable from a single power supply is obtained, wherein both input voltages $V_{IN1}$ and $V_{IN2}$ can be at ground without disrupting circuit operation.

Figure 4:
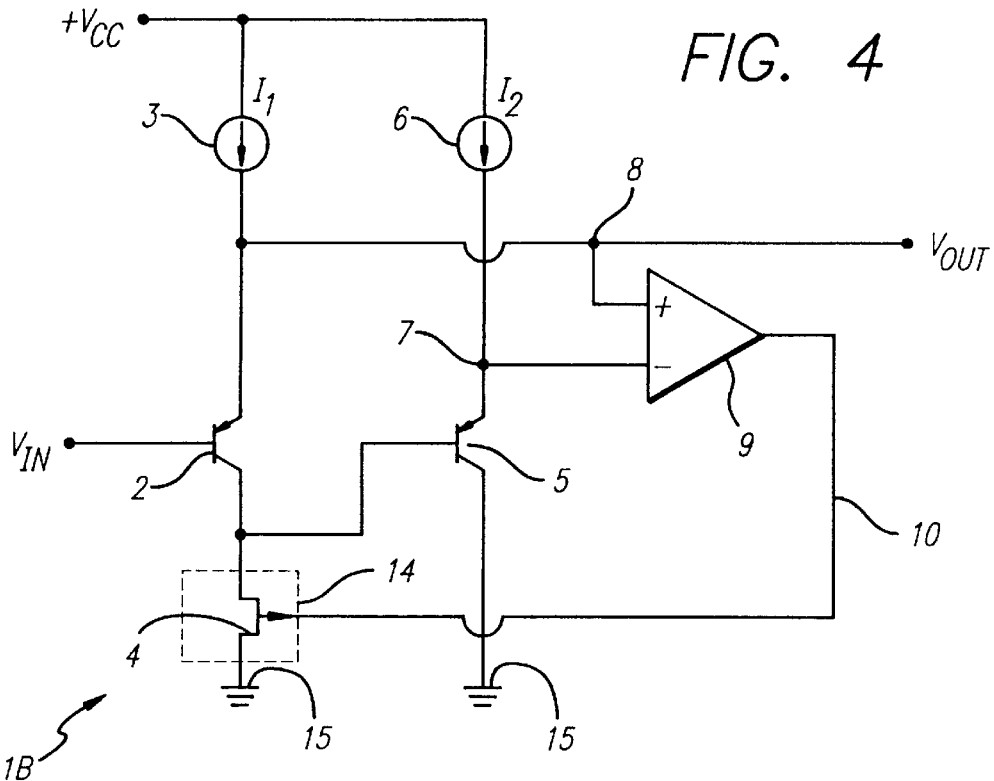
FIG. 4 is a schematic diagram of a modification to the embodiment of FIG. 2.

Referring now to FIG. 4, voltage shift circuit 1B is identical to the circuit 1A shown in FIG. 2, except that the collector of PNP transistor 5 is no longer connected to its base, and instead is connected to ground conductor 15. Transistor 5 is be formed as a PNP substrate transistor in a typical bipolar integrated circuit manufacturing process. This construction is efficient for reducing the ratio of the emitter area of lateral PNP transistor 2 to the emitter area of PNP transistor 5 to achieve the desired 50 to 100 millivolt difference between $V_{BE(2)}$ and $V_{BE(5)}$ mentioned above.

Figure 5:
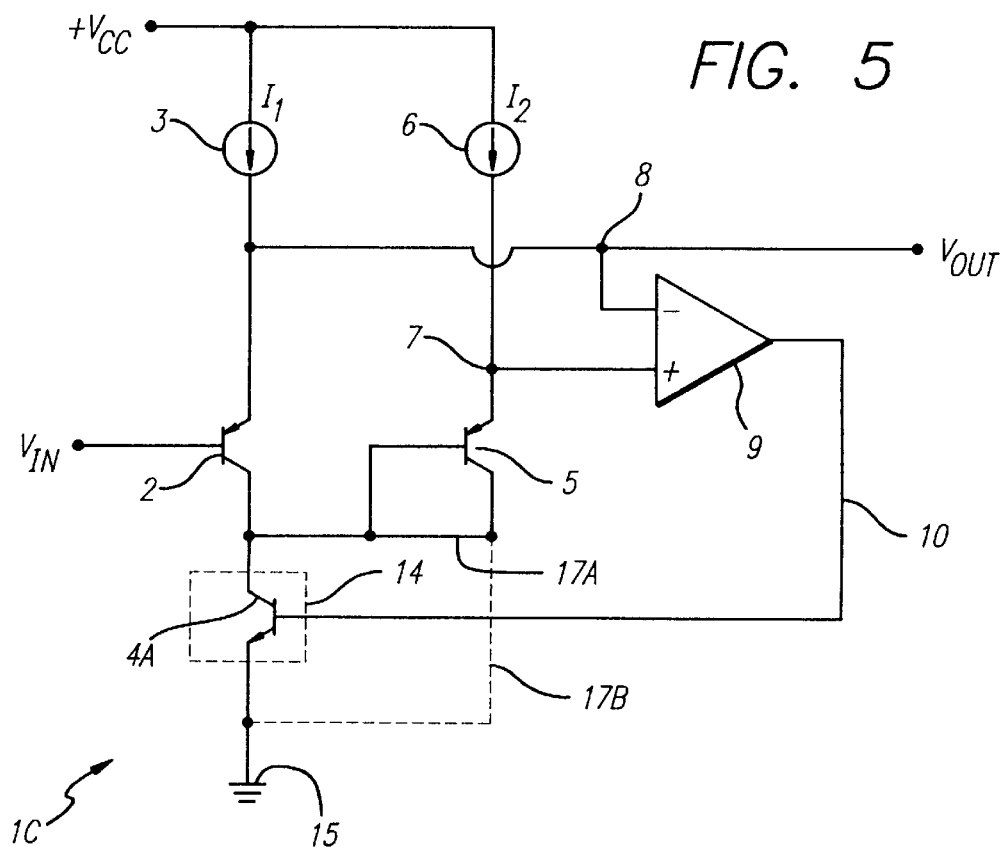
FIG. 5 is a schematic diagram of an alternative embodiment of the invention.

In FIG. 5, voltage shift circuit 1C is similar to the circuits 1A and 1B described with reference to FIGS. 2 and 4, except that P-channel JFET 4 has been replaced with an NPN transistor 4A. The dotted lines 17A and 17B between the collector of transistor 5 and its base or conductor 15 are alternative connections. To obtain the desired circuit operation for $V_{IN}$ equal to or very close to ground, it would be necessary for the difference between $V_{BE(2)}$ and $V_{BE(5)}$ to be equal to or exceed the $V_{CE(SAT)}$ of PNP transistor 4A.

Figure 6:
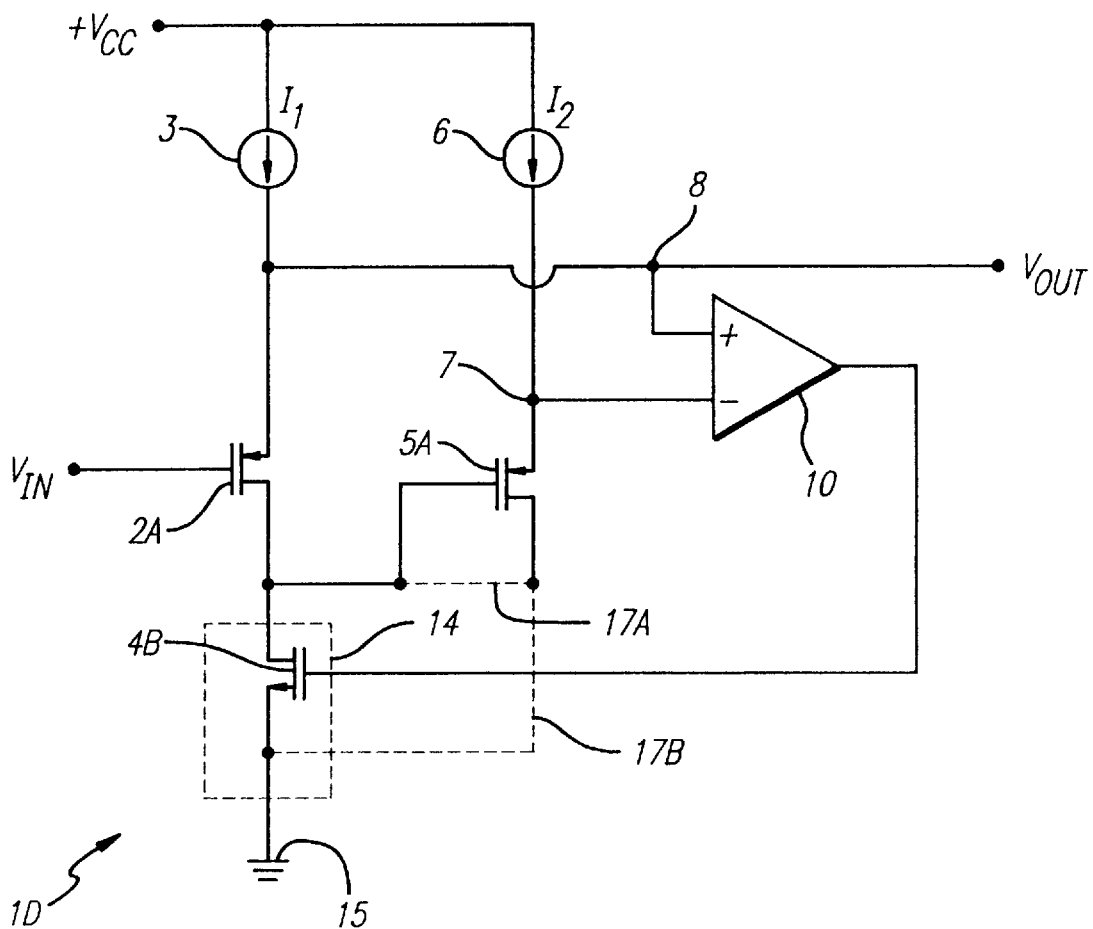
FIG. 6 is a schematic diagram of another embodiment of the invention.

Referring to FIG. 6, the above principles can be easily implemented using a CMOS process, wherein P-channel MOSFETs 2A and 5A replace PNP transistors 2 and 5, respectively, in FIG. 2, and an N-channel MOSFET 4B replaces NPN transistor 4A of FIG. 5. The optional connection of the drain of P-channel MOSFET 5A to either its base or ground conductor 15 is shown by dotted lines 17A and 17B.

While the invention has been described with reference to several particular embodiments thereof, those skilled in the art will be able to make the various modifications to the described embodiments of the invention without departing from the true spirit and scope of the invention. It is intended that all combinations of elements and steps which perform substantially the same function in substantially the same way to achieve the same result are within the scope of the invention.

What is claimed is:

1. A precision voltage level shift circuit, comprising in combination:
    (a) an emitter follower input circuit including a first transistor having a base receiving an input voltage, and an emitter coupled to both an output terminal and a first current source;
    (b) a load element coupled between a collector of the input transistor and a first supply voltage conductor;
    (c) a second transistor having a base coupled to the collector of the first transistor and an emitter coupled to a second current source; and
    (d) a differential amplifier having a first input coupled to the output terminal, a second input coupled to the emitter of the second transistor, and an output coupled to the load element.

2. The precision voltage level shift circuit of claim 1 wherein the first transistor is a lateral PNP transistor having the characteristic that its base emitter voltage is strongly dependent on it collector-emitter voltage.

3. The precision voltage level shift circuit of claim 2 wherein the second transistor is a lateral PNP transistor.

4. The precision voltage level shift circuit of claim 3 wherein the collector of the second transistor is coupled to its base.

5. The precision voltage level shift circuit of claim 3 wherein the collector of the second transistor is coupled to the first supply voltage conductor.

6. The precision voltage level shift circuit of claim 5 wherein the second transistor is a substrate PNP transistor.

7. The precision voltage level shift circuit of claim 2 wherein the load element includes a P-channel field effect transistor coupled between the collector of the first transistor and the first supply voltage conductor, the output of the differential amplifier being coupled to a gate electrode of the P-channel field effect transistor.

8. The precision voltage level shift circuit of claim 7 wherein the output terminal is coupled to a non-inverting input of the differential amplifier.

9. The precision voltage level shift circuit of claim 1 wherein the differential amplifier operates to maintain the voltage drop across the load element at a level such that the emitter of the second transistor is equal to the voltage of the emitter of the first transistor to thereby maintain the collector-emitter voltage of the first transistor at the nearly constant value of the base-emitter voltage of the second transistor.

10. The precision voltage level shift circuit of claim 3 wherein the load element includes an NPN transistor having a collector coupled to the collector of the first transistor, an emitter coupled to the ground voltage conductor, and a base coupled to the output of the differential amplifier.

11. A precision voltage level shift circuit, comprising in combination:
    (a) a source follower input circuit including a first transistor having a gate receiving an input voltage, and a source coupled to both an output terminal and a first current source;
    (b) a load element coupled between a collector of the input transistor and a first supply voltage conductor;
    (c) a second transistor having a gate coupled to the drain of the first transistor and a source coupled to a second current source; and
    (d) a differential amplifier having a first input coupled to the output terminal, a second input coupled to the source of the second transistor, and an output coupled to the load element.

12. The precision voltage level shift circuit of claim 11 wherein the first and second transistors are P-channel field effect transistors and the load element is an N-channel MOS field effect transistor having a gate coupled to the output of the differential amplifier, a source coupled to the first supply voltage conductor, and a drain coupled to the drain of the first transistor.

13. An instrumentation amplifier operable from a single power supply, with input voltages as low as a ground voltage provided by the single power supply, comprising in combination:
    (a) first and second operational amplifiers each having an output, an inverting input, and a non-inverting input;
    (b) a first resistor coupled between a reference voltage and the inverting input of the first operational amplifier, a second resistor coupled between the inverting input and the output of the first operational amplifier, a third resistor coupling the output of the first operational amplifier and the inverting input of the second operational amplifier, a fourth resistor coupled between the inverting inputs of the first and second operational amplifiers, and a fifth resistor coupled between the output and inverting input of the second operational amplifier;
    (c) a first voltage level shift circuit having an input terminal for receiving a first input voltage and an output terminal coupled to the non-inverting input of the first operational amplifier, and a second voltage level shift circuit having an input terminal for receiving a second input voltage and an output terminal coupled to the non-inverting input of the second operational amplifier, each of the first and second voltage level shift circuits including
        i. an emitter follower input circuit including a first transistor having a base coupled to the input terminal and an emitter coupled to both the output terminal and a first current source;
        ii. a load element coupled between a collector of the input transistor and a first supply voltage conductor;
        iii. a second transistor having a base coupled to the collector of the first transistor and an emitter coupled to a second current source; and
        iv. a differential amplifier having a first input coupled to the output terminal, a second input coupled to the emitter of the second transistor, and an output coupled to the load element.

14. An instrumentation amplifier operable from a single power supply, with input voltages as low as a ground voltage provided by the single power supply, comprising in combination:
    (a) first and second operational amplifiers each having an output, an inverting input, and a non-inverting input;
    (b) a first resistor coupled between a reference voltage and the inverting input of the first operational amplifier, a second resistor coupled between the inverting input and the output of the first operational amplifier, a third resistor coupling the output of the first operational amplifier and the inverting input of the second operational amplifier, a fourth resistor coupled between the inverting inputs of the first and second operational amplifiers, and a fifth resistor coupled between the output and inverting input of the second operational amplifier;

(c) a first voltage level shift circuit having an input terminal for receiving a first input voltage and an output terminal coupled to the non-inverting input of the first operational amplifier, and a second voltage level shift circuit having an input terminal for receiving a second input voltage and an output terminal coupled to the non-inverting input of the second operational amplifier, each of the first and second voltage level shift circuits including i. an source follower input circuit including a first transistor having a gate coupled to the input terminal and a source coupled to both the output terminal and a first current source;

ii. a load element coupled between a drain of the input transistor and a first supply voltage conductor;

iii. a second transistor having a gate coupled to the drain of the first transistor and a source coupled to a second current source; and iv. a differential amplifier having a first input coupled to the output terminal, a second input coupled to the source of the second transistor, and an output coupled to the load element.

* * * * *